United States Patent
Moriyama et al.

(10) Patent No.: US 8,906,153 B2
(45) Date of Patent: Dec. 9, 2014

(54) PRODUCT OF POLYSILOXANE CONDENSATION

(75) Inventors: Reiko Moriyama, Tokyo (JP); Hideo Saito, Tokyo (JP); Syouzou Takada, Tokyo (JP); Ichirou Doi, Tokyo (JP)

(73) Assignee: Asahi Kasei E-materials Corporation, Tokyo (JP)

( * ) Notice: Subject to any disclaimer, the term of this patent is extended or adjusted under 35 U.S.C. 154(b) by 56 days.

(21) Appl. No.: 13/380,630

(22) PCT Filed: Jun. 24, 2010

(86) PCT No.: PCT/JP2010/060787
§ 371 (c)(1),
(2), (4) Date: Dec. 23, 2011

(87) PCT Pub. No.: WO2010/150861
PCT Pub. Date: Dec. 29, 2010

(65) Prior Publication Data
US 2012/0100298 A1    Apr. 26, 2012

(30) Foreign Application Priority Data

Jun. 24, 2009  (JP) ................................ 2009-149840
Nov. 6, 2009   (JP) ................................ 2009-254706
Nov. 6, 2009   (JP) ................................ 2009-254731

(51) Int. Cl.
| | | |
|---|---|---|
| C09D 183/04 | (2006.01) | |
| C08L 83/04 | (2006.01) | |
| H01L 21/312 | (2006.01) | |
| H01L 21/02 | (2006.01) | |
| C08G 77/04 | (2006.01) | |
| C08K 3/36 | (2006.01) | |
| C08G 77/02 | (2006.01) | |
| H01L 51/44 | (2006.01) | |

(52) U.S. Cl.
CPC ............ C08L 83/04 (2013.01); C08G 77/04 (2013.01); H01L 21/3121 (2013.01); H01L 21/02208 (2013.01); C08K 3/36 (2013.01); C08G 77/02 (2013.01); H01L 21/02282 (2013.01); H01L 51/448 (2013.01); H01L 21/02123 (2013.01)
USPC ............ 106/287.14; 106/287.16; 524/858; 428/447; 427/387

(58) Field of Classification Search
USPC ......... 106/287.14, 287.16; 524/858; 427/387; 428/447
See application file for complete search history.

(56) References Cited

U.S. PATENT DOCUMENTS

| | | | |
|---|---|---|---|
| 5,755,867 A * | 5/1998 | Chikuni et al. | 106/287.16 |
| 5,938,911 A | 8/1999 | Quenzer et al. | |
| RE38,850 E * | 10/2005 | Ikenaga et al. | 428/448 |
| 7,071,255 B2 * | 7/2006 | Nishimura et al. | 524/430 |
| 2004/0050297 A1 * | 3/2004 | Kobayashi et al. | 106/287.14 |

FOREIGN PATENT DOCUMENTS

| | | |
|---|---|---|
| EP | 1 278 238 A1 | 1/2003 |
| JP | 01-281747 A | 11/1989 |
| JP | 3-54279 A | 3/1991 |
| JP | 03-263476 A | 11/1991 |
| JP | 04-010418 A | 1/1992 |
| JP | 05-263045 A | 10/1993 |
| JP | 2851915 B2 | 1/1999 |
| JP | 11-335625 A | 12/1999 |
| JP | 2000-191786 A | 7/2000 |
| JP | 3163579 B2 | 5/2001 |
| JP | 2001-308090 A | 11/2001 |
| JP | 3320440 B2 | 9/2002 |
| JP | 2003-031568 A | 1/2003 |
| JP | 2006-310448 A | 11/2006 |
| JP | 2007-016191 A | 1/2007 |
| JP | 2008-248130 A | 10/2008 |
| JP | 2010-080776 A | 4/2010 |
| JP | 2010-150342 A | 7/2010 |

OTHER PUBLICATIONS

Database WPI, Week 199202, Thomson Scientific, London, GB; AN 1992-13067, XP 002682701, & JP 3-3263476 A (Nov. 22, 1991) *Abstract*.

Database WPI, Week 200702, Thomson Scientific, London, GB; AN 2007-012555, XP002682702, & JP 2006-310448 A (Nov. 9, 2006) *Abstract*.

(Continued)

*Primary Examiner* — Margaret Moore
(74) *Attorney, Agent, or Firm* — Birch, Stewart, Kolasch & Birch, LLP

(57) ABSTRACT

Provided is a condensation reaction product solution which is particularly suitable for filling a trench formed on a substrate having a narrow width and a high aspect ratio. The condensation reaction product solution has a long pot life, superior trench-filling when used for trench-filling, and a low cure shrinkage, an excellent crack resistance and a HF resistance when cured and converted into silicon oxide. The condensation reaction product solution comprises (I) a condensation reaction product obtained by condensation reaction from a condensation component comprising (i) 40% by mass or more and 99% by mass or less in equivalent of condensate of polysiloxane compound derived from silane compounds represented by the general formula (1): $R^1_n SiX^1_{4-n}$ (wherein n is an integer of 0 to 3, $R^1$ is hydrogen atom or a $C_{1-10}$ hydrocarbon group, and $X^1$ is a halogen atom, a $C_{1-6}$ alkoxy group or acetoxy group) and (ii) 1% by mass or more and 60% by mass or less of silica particles, and (II) a solvent, wherein the silane compounds represented by the general formula (1) are two or more types of silane compounds comprising a tetrafunctional silane compound which corresponds to the case of n=0 in the general formula (1) and a trifunctional silane compound which corresponds to the case of n=1 in the general formula (1).

7 Claims, 2 Drawing Sheets

(56) References Cited

OTHER PUBLICATIONS

European Search Report issued Sep. 11, 2012, in European Patent Application No. 10792179.3.
Office Action for Taiwanese Application No. 099120662, dated Feb. 8, 2013.
Pickup et al., "Structure of $(ZrO_2)_x(SiO_2)_{1-x}$ xerogels (x= 0.1, 0.2, 0.3 and 0.4) from FTIR, 29Si and 17O MAS NMR and EXAFS," Physical Chemistry Chemical Physics, vol. 1, 1999, pp. 2527-2533.
International Search Report for PCT/JP2010/060787 dated Sep. 28, 2010.
Office Action issued Oct. 31, 2012, in Chinese Patent Application No. 201080028167.9.

* cited by examiner

PRODUCT OF POLYSILOXANE CONDENSATION

TECHNICAL FIELD

The present invention relates to a polysiloxane condensation reaction product solution, in more detail, a polysiloxane condensation reaction product solution suitable for filling a trench formed on a semiconductor device, and further in more detail, a polysiloxane condensation reaction product solution for filling a trench which is suitable for an insulating protective layer. The present invention also relates to a method for producing the above-described polysiloxane condensation reaction product solution and an application of the polysiloxane condensation reaction product solution.

BACKGROUND ART

In recent years, a number of semiconductor memory devices in which memory cells are arranged three-dimensionally have been proposed to increase the integration degree of memory. In such semiconductor devices, it is necessary to electrically separate memory cells or circuit elements from each other by forming a trench in a gap between memory cells or circuit elements or the like and filling the trench with an insulating material. As integration degree is increased, there is a tendency that the opening width of a trench becomes narrower and the aspect ratio of a trench (i.e., a value wherein depth of trench is divided by opening width of trench) becomes higher. Further, in a semiconductor memory device having three-dimensional structure, it is necessary for them to be crack resistance for a thicker layer when cured at a temperature of 700° C. or higher.

As such a material for filling a trench, silicon oxide has been widely and suitably used due to a high electric insulation.

As a means for filling a trench with silicon oxide, until now, silicon oxide layer had been formed on a silicon substrate having a trench, by a CVD method. However, along with recent miniaturization of semiconductor device, there is a tendency that opening width becomes narrower and aspect ratio becomes higher. For this reason, when a trench having an opening width of 0.2 μm or less and an aspect ratio of 2 or more was filled with silicon oxide by the CVD method, there was a problem that void (unfilled part) or seams (seam-like unfilled part) in the trench tended to be generated.

As a method other than the CVD method, a method has been known where microtrenchs are filled by a coating method and cured under oxidative atmosphere to form a silica layer. As a material to be used in this method, polysilazane material, polysilane material, and silicone material are known.

Among the polysilazane materials, hydrogenated polysilazane has been reported to have features such as superior trench-filling and low cure shrinkage when converted to a silicon oxide layer (see, for example, Patent Literature 1). However, hydrogenated polysilazane has a problem that a substrate tends to be easily oxidized because it requires curing by steam oxidation. Furthermore, in recent years, since there was a tendency that the width of a trench is becoming narrower and the depth of a trench is becoming deeper, there have been problems such as insufficient trench-filling, generation of cracks in a thick layer, risk of ammonia gas generated during curing.

In addition, the polysilane material had such problems that a coated polysilane compound was easily vaporized, and that a crack was generated in a thick layer (see, for example, Patent Literature 2).

The silicone material had a problem that voids or cracks were generated in an obtained silicon oxide layer because dehydration and dealcoholized condensation reaction were accompanied when coated layer was cured. Further, since great cure shrinkage was accompanied when the silicone material was converted to silicon oxide, there was a problem that density became uneven from the layer surface to the bottom.

As a method for avoiding the generation of voids and cracks using the silicone material, a composition comprising silica particles and polysiloxane compound has been proposed (see, for example, Patent Literature 3).

However, since silica particles defined as silicon oxide particles and polysiloxane compound defined as silicon atom binder in Patent Literature 3 were only mixed each other, there was such problems that pot life (storage stability at room temperature) of the solution was not sufficient, and that trench-filling for a trench having 30 nm or less opening width and 15 or more aspect ratio was not satisfactory as well as voids being generated.

A material obtained by condensation reaction of silica particles and polysiloxane compound has been described, for example, in Patent Literatures 4 to 6. However, the material described in Patent Literatures 4 to 6 is the one which was designed for use as an interlayer insulating layer or the like. Since trench-filling is not required in the use as an interlayer insulating layer, there is no description of trench-filling in these literatures.

PRIOR ART TECHNOLOGY LITERATURES

Patent Literatures

Patent Literature 1: JP-A-2001-308090
Patent Literature 2: JP-A-2003-31568
Patent Literature 3: JP-A-2006-310448
Patent Literature 4: JP No. 3320440
Patent Literature 5: JP No. 2851915
Patent Literature 6: JP No. 3163579

SUMMARY OF THE INVENTION

Problem to be Solved by the Invention

Further, according to the confirmatory experiment by the present inventors, it was found that when a ratio of a component derived from tetrafunctional silane compounds in the polysiloxane compound which was defined as a hydrolysate in Patent Literatures 4 to 6 was 100% by mole, there were such problems that a thick layer having a thickness of 1 μm or more could not be formed due to inferior crack resistance and that HF resistance was also inferior. In addition, it was also found that when a ratio of a component derived from trifunctional silane compounds in the polysiloxane compound was 100% by mole, there were such problems that layer-forming property, adhesion to substrate, and trench-filling were inferior. Furthermore, as for polysiloxane compound composed of a tetrafunctional silane compound and a trifunctional silane compound, an example of the compound containing 70% by mole or more of silica particles which was defined as silica sol had been described in Patent Literatures 4 to 6, but it was found that there were problems such as crack resistance and trench-filling were inferior due to the ratio of silica particles being high in this example.

It is an object of the present invention to provide a condensation reaction product, which has a long pot life, a low cure shrinkage when converted to silicon oxide by curing, and superior crack resistance and HF resistance. Further, it is another object of the present invention to provide a condensation reaction product which can be suitably used for filling a trench having a narrow opening width and a high aspect ratio formed on a substrate, wherein the condensation reaction product has a long pot life, a superior layer-forming property and adhesion to a substrate, a superior trench-filling when used for filling a trench, a low cure shrinkage when converted to silicon oxide by curing, and superior crack resistance and HF resistance.

Means for Solving the Problems

The present inventors have intensively studied to develop a method for achieving the above-describe objects, and as a result, they have found that the condensation reaction product solution shown below has a long pot life, a low cure shrinkage when converted to silicon oxide by curing, and superior crack resistance and HF resistance, in particular, found that the condensation reaction product solution is useful as a composition for filling a trench due to superior trench-filling, and completed the present invention. That is, the present invention is as follows.

[1] A condensation reaction product solution comprising:
(I) a condensation reaction product obtained by condensation reaction from a condensation component containing at least (i) 40% by mass or more and 99% by mass or less in equivalent of condensate of the polysiloxane compound derived from silane compounds represented by the following general formula (1):

$$R^1{}_n SiX^1{}_{4-n} \quad (1)$$

{wherein n is an integer of 0 to 3, $R^1$ is hydrogen atom or a $C_{1-10}$ hydrocarbon group, $X^1$ is a halogen atom, a $C_{1-6}$ alkoxy group or acetoxy group}, and (ii) 1% by mass or more and 60% by mass or less of silica particles; and
(II) a solvent;
wherein the silane compounds represented by the general formula (1) are composed of two or more types of silane compounds comprising at least a tetrafunctional silane compound which corresponds to the case of n=0 in the general formula (1) and a trifunctional silane compound which corresponds to the case of n=1 in the general formula (1).

[2] The condensation reaction product solution according to the above-described item [1], wherein the condensation component contains 50% by mass or more and 90% by mass or less in equivalent of condensate of a polysiloxane compound and 10% by mass or more and 50% by mass or less of the silica particles; and
ratio of a component derived from a tetrafunctional silane compound represented by the following general formula (2):

$$SiX^2{}_4 \quad (2)$$

{wherein $X^2$ is a halogen atom, a $C_{1-6}$ alkoxy group or acetoxy group};
in the polysiloxane compound is 5% by mole or more and 40% by mole or less.

[3] The condensation reaction product solution according to the above-described item [1] or [2], wherein ratio of a compound derived from a trifunctional silane compound represented by the following general formula (3):

$$R^2 SiX^3{}_3 \quad (3)$$

{wherein $R^2$ is a $C_{1-10}$ hydrocarbon group, $X^3$ is a halogen atom, a $C_{1-6}$ alkoxy group, or acetoxy group};
in the polysiloxane compound is 60% by mole or more and 95% by mole or less.

[4] The condensation reaction product solution according to any one of the above-described items [1] to [3], wherein, in $^{29}$Si NMR analysis, the peak intensity (A) of total tetrafunctional siloxane components in the condensation reaction product to the peak intensity (B) of components corresponding to siloxane bonding number of 4 in the condensation reaction product satisfy the following relationship:

$$\{(B)/(A)\} \geq 0.50$$

[5] The condensation reaction product solution according to any one of the above-described items [1] to [4], wherein the weight average molecular weight of the condensation reaction product is 1,000 or more and 20,000 or less.

[6] The condensation reaction product solution according to any one of the above-described items [1] to [5] for use to fill a trench formed on a semiconductor device.

[7] A method for producing the condensation reaction product solution according to any one of the above-described items [1] to [6], comprising:
a first step where silane compounds composed of 5% by mole or more and 40% by mole or less of tetrafunctional silane compounds represented by the following general formula (2):

$$SiX^2{}_4 \quad (2)$$

{wherein $X^2$ is a halogen atom, a $C_{1-6}$ alkoxy group, or acetoxy group};
and 60% by mole or more and 95% by mole or less of trifunctional silane compounds represented by the following general formula (3):

$$R^2 SiX^3{}_3 \quad (3)$$

{wherein $R^2$ is a $C_{1-10}$ hydrocarbon group, $X^3$ is a halogen atom, a $C_{1-6}$ alkoxy group, or acetoxy group};
are subjected to hydrolytic polycondensation in an aqueous alcohol solution under weak acidic condition of pH 5 or higher and lower than 7, to obtain polysiloxane compound;
a second step where a condensation component composed of 40% by mass or more and 99% by mass or less in equivalent of condensate of the polysiloxane compound obtained in the first step and 1% by mass or more and 60% by mass or less of silica particles are subjected to condensation reaction, in an aqueous solution of $C_{1-4}$ alcohol, under the condition of pH 6 to 8, at 50° C. or higher to obtain the reactin solution, and
a third step where at least one kind of solvent having a boiling point of 100° C. or higher and 200° C. or lower selected from a group consisting of alcohol, ketone, ester, ether and hydrocarbon-based solvent is added to the reaction solution obtained in the second step, then components having a boiling point of 100° C. or lower are removed by distillation, to obtain a condensation reaction product solution.

[8] A method for forming an insulating layer comprising:
a coating step where the condensation reaction product solution according to any one of the above-described items [1] to [6] is coated on a substrate to obtain a coated substrate; and
a curing step where the coated substrate obtained in the coating step is heated.
[9] The method for forming an insulating layer according to the above-described item [8], wherein the substrate has a trench structure.

Effect of the Invention

The condensation reaction product solution of the present invention has a long pot life, low cure shrinkage when converted to silicon oxide by curing, superior crack resistance and HF resistance, and further, superior trench-filling when used for filling a trench. Consequently, the condensation reaction product solution of the present invention is particularly suitable for filling a trench having a narrow opening width and a high aspect ratio formed on a substrate.

BRIEF DESCRIPTION OF THE DRAWINGS

FIG. 1 is a $^{29}$Si NMR spectrum of Example 1 in the present invention.
FIG. 2 is a $^{29}$Si NMR spectrum of Comparative Example 3 in the present invention.

EMBODIMENTS FOR CARRYING OUT THE INVENTION

Figure 1:
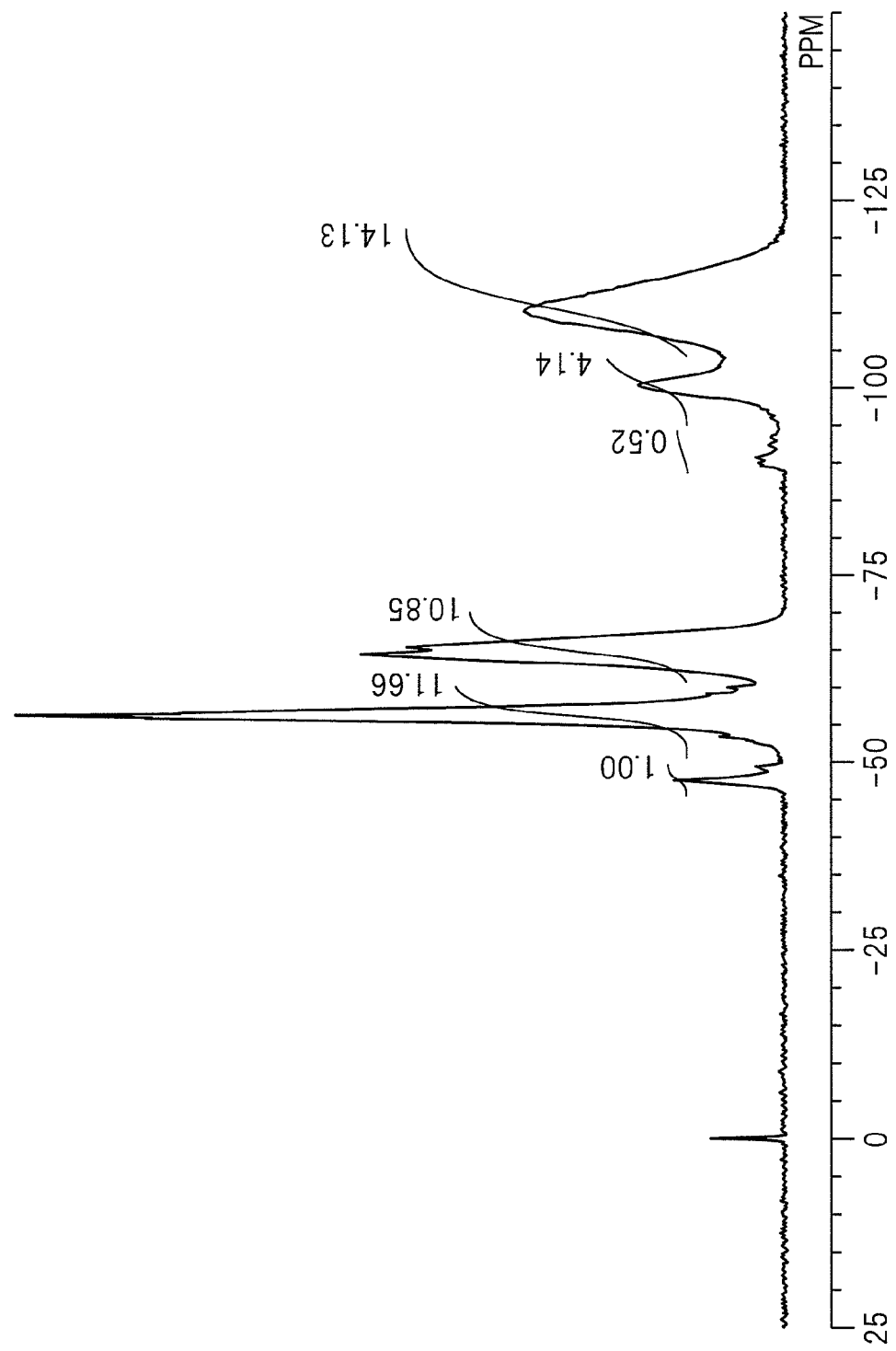
[FIG. 1]

Hereinafter, embodiments of the present invention will be explained in detail.
[Condensation Reaction Product Solution]
The present invention provides a condensation reaction product solution comprising: (I) a condensation product obtained by condensation reaction from a condensation component containing at least (i) 40% by mass or more and 99% by mass or less in equivalent of condensate of a polysiloxane compound derived from silane compounds represented by the following general formula (1):

{wherein n is an integer of 0 to 3, $R^1$ is hydrogen atom or a $C_{1-10}$ hydrocarbon group, $X^1$ is a halogen atom, a $C_{1-6}$ alkoxy group or acetoxy group}, and (ii) 1% by mass or more and 60% by mass or less of silica particles, and (II) a solvent, wherein the silane compounds represented by the general formula (1) are composed of two or more types of silane compounds comprising at least a tetrafunctional silane compound which corresponds to the case of n=0 in the general formula (1) and a trifunctional silane compound which corresponds to the case of n=1 in the general formula (1). It should be noted that content in the condensation component described herein is a amount when the total mass of all components in the condensation component (however, contents of polysiloxane compound and an optional silane compound are replaced by a equivalent of condensate) is assumed as 100% by mass.
The present invention can realize both layer thickening and filling a trench having a narrow opening width and a high aspect ratio as described above, by subjecting the condensation component which has an optimized ratio of silica particles to the above-described polysiloxane compound derived from two or more kinds of silane compounds to condensation reaction. The present invention has found out that optimization of the condensation reaction product composition is effective, and further preferably that reduction in viscosity of the condensation reaction product is effective, to fill a trench with the condensation reaction product without generation of voids or seams in a trench. And, the present invention has found out that the viscosity can be reduced by optimizing molecular weight of the condensation reaction product and silanol group ratio in Q structure.
<Condensation Reaction Product>
The condensation reaction product is represented by the above-described general formula (1), and can be obtained by subjecting a condensation component containing a polysilane compound derived from two or more types of silane compounds containing at least a tetrafunctional silane compound and a trifunctional silane compound and silica particles in a predetermined composition to a condensation reaction.
(Polysiloxane Compound)
The polysiloxane compound to be used in the present invention is derived from the silane compounds represented by the above-described general formula (1). More specifically, the polysiloxane compound is a polycondensate of the silane compounds represented by the above-described general formula (1). Further, the silane compounds represented by the above-described general formula (1) to be used in the present invention are two or more types of silane compounds comprising at least a tetrafunctional silane compound which corresponds to the case of n=0 in the general formula (1) and a trifunctional silane compound which corresponds to the case of n=1 in the general formula (1).
Specific example of $R^1$ in the above-described general formula (1) includes: a non-cyclic or cyclic aliphatic hydrocarbon group such as methyl, ethyl, n-propyl, isopropyl, n-butyl, sec-butyl, t-butyl, n-pentyl, iso-pentyl, neopentyl, cyclopentyl, n-hexyl, iso-hexyl, cyclohexyl, n-heptyl, iso-heptyl, n-octyl, iso-octyl, t-octyl, n-nonyl, iso-nonyl, n-decyl and isodecyl; non-cyclic or a cyclic alkenyl group such as vinyl, propenyl, butenyl, pentenyl, hexenyl, cyclohexenyl, cyclohexenylethyl, norbornenylethyl, heptenyl, octenyl, nonenyl, decenyl and styrenyl; an aralkyl group such as benzyl, phenetyl, 2-methylbenzyl, 3-methylbenzyl and 4-methylbenzyl; an arylalkenyl group such as PhCH=CH—; an aryl group such as phenyl, tolyl and xylyl; and the like. Further, specific example of $R^1$ includes hydrogen atom. Among them, $R^1$ is preferably hydrogen atom, methyl or ethyl, and more preferably methyl, from the viewpoint that these groups can provide a condensation reaction product which exhibits less weight loss and low shrinkage rate when converted to silicon oxide by curing.
Specific example of $X^1$ in the above-described general formula (1) includes, for example, a halogen atom such as chlorine, bromine and iodine; an alkoxy group such as methoxy, ethoxy, n-propyloxy, iso-propyloxy, n-butyloxy, t-butyloxy, n-hexyloxy and cyclohexyloxy; acetoxy group; and the like. Among them, a halogen atom such as chlorine, bromine and iodine; an alkoxy group such as methoxy and ethoxy; and acetoxy group are preferable, due to a high reactivity in the condensation reaction.
In the above-described polysiloxane compound, by containing a component derived from a tetrafunctional silane compound which corresponds to the case of n=0 in the general formula (1) layer-forming property and adhesion to a substrate become superior, and by containing a component derived from a trifunctional silane compound which corresponds to the case of n=1 in the general formula (1), crack resistance and HF resistance as well as trench-filling become superior. In the present invention, by using a polysilane compound derived from two or more types of silane compounds having the above-described specified composition, a condensation reaction product solution having superior layer-forming property, adhesion to a substrate, crack resistance and HF resistance as well as trench-filling can be obtained. Hereinafter, more preferable embodiments of the tetrafunctional silane compound and the trifunctional silane compound will be explained.

Ratio of a component derived from a tetrafunctional silane compound represented by the following general formula (2):

$$SiX^2_4 \quad (2)$$

{wherein $X^2$ is a halogen atom, a $C_{1-6}$ alkoxy group or acetoxy group};
in the polysiloxane compound to be used in the present invention is preferably 5% by mole or more and 40% by mole or less. It should be noted that the structure of $X^2$ in the above-described general formula (2) corresponds to the structure of $X^1$ in the above-described general formula (1), and the structure of the general formula (2) represents a part of the structure of the general formula (1). The ratio of a component derived from a tetrafunctional silane compound represented by the general formula (2) is preferably 5% by mole or more because layer-forming property and adhesion to a substrate are superior, and the ratio is more preferably 10% by mole or more. On the other hand, the ratio is preferably 40% by mole or less because HF resistance is superior, and the ratio is more preferably 35% by mole or less, and further more preferably 30% by mole or less.

Specific example of $X^2$ in the above-described general formula (2) includes, for example, a halogen atom such as chlorine, bromine and iodine; an alkoxy group such as methoxy, ethoxy, n-propyloxy, iso-propyloxy, n-butyloxy, t-butyloxy, n-hexyloxy and cyclohexyloxy; acetoxy group; and the like. Among them, a halogen atom such as chlorine, bromine and iodine; an alkoxy group such as methoxy and ethoxy; and acetoxy group are preferable, due to a high reactivity in the condensation reaction.

Among them, an embodiment, where the condensation component to be used in the present invention contains 50% by mass or more and 90% by mass or less in equivalent of condensate of polysiloxane compound represented by the general formula (1) and 10% by mass or more and 50% by mass or less of silica particles, and ratio of a component derived from a tetrafunctional silane compound represented by the above-described general formula (2) is 5% by mole or more and 40% by mole or less, is particularly preferable.

Ratio of a component derived from a trifunctional silane compound represented by the following general formula (3):

$$R^2SiX^3_3 \quad (3)$$

{wherein $R^2$ is a $C_{1-10}$ hydrocarbon group, $X^3$ is a halogen atom, a $C_{1-6}$ alkoxy group, or acetoxy group};
in the polysilane compounds is preferably 60% by mole or more and 95% by mole or less. It should be noted that the structure of $X^3$ in the above-described general formula (3) corresponds to the structure of $X^1$ in the above-described general formula (1), and the structure of $R^2$ in the general formula (3) represents a part of $R^1$ in the general formula (1). That is, the structure of the general formula (3) represents a part of the structure of the general formula (1). The ratio of a component derived from a trifunctional silane compound represented by the general formula (3) of 60% by mole or more is preferable, because HF resistance and crack resistance as well as trench-filling are superior, and the ratio is more preferably 65% by mole or more, and further more preferably 70% by mole or more. On the other hand, the ratio is preferably 95% by mole or less because layer-forming property and adhesion to a substrate are superior, and the content is more preferably 90% by mole or less.

It should be noted that a structure of the polysiloxane compound, in particular, presences and contents of structures represented by the above-described general formulas (1), (2) and (3), respectively, can be confirmed by $^{29}Si$ NMR.

Specific example of $R^2$ in the above-described general formula (3) includes: a non-cyclic or cyclic aliphatic hydrocarbon group such as methyl, ethyl, n-propyl, isopropyl, n-butyl, sec-butyl, t-butyl, n-pentyl, iso-pentyl, neopentyl, cyclopentyl, n-hexyl, iso-hexyl, cyclohexyl, n-heptyl, iso-heptyl, n-octyl, iso-octyl, t-octyl, n-nonyl, iso-nonyl, n-decyl and isodecyl; a non-cyclic or cyclic alkenyl group such as vinyl, propenyl, butenyl, pentenyl, hexenyl, cyclohexenyl, cyclohexenylethyl, norbornenylethyl, heptenyl, octenyl, nonenyl, decenyl and styrenyl; an aralkyl group such as benzyl, phenetyl, 2-methylbenzyl, 3-methylbenzyl and 4-methylbenzyl; an arylalkenyl group such as PhCH=CH—; an aryl group such as phenyl, tolyl and xylyl; and the like. Among them, $R^2$ is preferably methyl or ethyl, and more preferably methyl, from the viewpoint that these groups can provide a condensation reaction product which exhibits a reduced weight loss and a low shrinkage rate when converted to silicon oxide by curing.

Specific example of $X^3$ in the above-described general formula (3) includes, for example, a halogen atom such as chlorine, bromine and iodine; an alkoxy group such as methoxy, ethoxy, n-propyloxy, iso-propyloxy, n-butyloxy, t-butyloxy, n-hexyloxy and cyclohexyloxy; acetoxy group; and the like. Among them, a halogen atom such as chlorine, bromine and iodine; an alkoxy group such as methoxy and ethoxy; and acetoxy group are preferable, due to a high reactivity in the condensation reaction.

(Production of Polysiloxane Compound)

The polysiloxane compound can be produced, for example, by a method where the above-described silane compounds are subjected to condensation polymerization in the presence of water. In this case, the condensation polymerization is carried out in the presence of water in a range of preferably 0.1 equivalent or more and 10 equivalents or less, and more preferably 0.4 equivalent or more and 8 equivalents or less relative to the number of $X^1$ contained in the silane compound represented by the above-described general formula (1) under acidic atmosphere. The amount of water in the above-described range is preferable, because pot life of the condensation reaction product solution can be extended, and crack resistance after layer formation can be improved.

When the silane compound to be used for producing polysiloxane compound contains a halogen atom or acetoxy group as $X^1$ in the above-described general formula (1), an acid catalyst may either be used or not be used in addition to the silane compound, because the reaction system shows acidic by adding water for the condensation reaction. On the other hand, when $X^1$ in the above-described general formula (1) is an alkoxy group, it is preferable to add an acid catalyst.

The acid catalyst includes inorganic acid and organic acid. The above-described inorganic acid includes, for example, hydrochloric acid, nitric acid, sulfuric acid, hydrofluoric acid, phosphoric acid and boric acid, and the like. The above-described organic acid includes, for example, acetic acid, propionic acid, butanoic acid, pentanoic acid, hexanoic acid, heptanoic acid, octanoic acid, nonanoic acid, decanoic acid, oxalic acid, maleic acid, methylmalonic acid, benzoic acid, p-aminobenzoic acid, p-toluenesulfonic acid, benzenesulfonic acid, trifluoroacetic acid, formic acid, malonic acid, sulfonic acid, phthalic acid, fumaric acid, citric acid, tartaric acid, citraconic acid, malic acid, and glutaric acid, and the like.

The above-described inorganic acid and organic acid can be used alone or in combination of two or more kinds. Further, amount of acid catalyst to be used is preferably an amount by which the pH of the reaction system in production of the polysiloxane compound is adjusted in a range of 0.01 to 7.0, and preferably 5.0 to 7.0. In this case, the weight average molecular weight of the polysiloxane compound can be well controlled.

The polysiloxane compound can be produced in an organic solvent or a mixed solvent of water and an organic solvent. The above-described organic solvent includes, for example, alcohols, esters, ketones, ethers, aliphatic hydrocarbons, aromatic hydrocarbons, amide compounds, and the like.

The above-described alcohols include, for example, monohydric alcohols such as methyl alcohol, ethyl alcohol, propyl alcohol and butyl alcohol; polyhydric alcohols such as ethylene glycol, diethylene glycol, propylene glycol, glycerin, trimethylolpropane and hexanetriol: monoethers of polyhydric alcohols such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether and propylene glycol monobutyl ether; and the like.

The above-described esters include, for example, methyl acetate, ethyl acetate, and butyl acetate, and the like.

The above-described ketones include, for example, acetone, methyl ethyl ketone, methyl isoamyl ketone, and the like.

The above-described ethers include, besides the above-described monoethers of polyhydric alcohols, for example, polyhydric alcohol ethers where all hydroxyl groups of polyhydric alcohol have been alkyl-etherated such as ethylene glycol dimethyl ether, ethylene glycol diethyl ether, ethylene glycol dipropyl ether, ethylene glycol dibutyl ether, propylene glycol dimethyl ether, propylene glycol diethyl ether, propylene glycol dibutyl ether, diethylene glycol dimethyl ether, diethylene glycol methylethyl ether, and diethylene glycol diethyl ether; tetrahydrofuran; 1,4-dioxane, and anisole; and the like.

The above-described aliphatic hydrocarbons include, for example, hexane, heptane, octane, nonane, and decane, and the like.

The above-described aromatic hydrocarbons include, for example, benzene, toluene, xylene, and the like.

The above-described amide compounds include, for example, dimethylformamide, dimethylacetoamide, and N-methylpyrolidone, and the like.

Among the above-described solvents, alcohol type solvent such as methanol, ethanol, isopropanol and butanol; ketone type solvent such as acetone, methyl ethyl ketone and methyl isobutyl ketone; ether type solvent such as ethylene glycol monomethyl ether, diethylene glycol monobutyl ether, propylene glycol monomethyl ether and propylene glycol monoethyl ether; and amide compound type solvent such as dimethylformamide, dimethylacetoamide and N-methylpyrrolidone, are preferable because these solvents are miscible with water and easy to disperse silica particles therein.

In a preferable embodiment, the polysiloxane compound can be produced by hydrolytic condensation polymerization in an aqueous alcohol solution under the weak acidic condition of pH 5 or higher and lower than 7.

These solvents may be used alone or in combination. Further, bulk reaction without using any of the above-described solvents may be carried out.

The reaction temperature in producing the polysiloxane compound is not particularly limited, but the reaction is carried out in a range of preferably −50° C. or higher and 200° C. or lower, and more preferably 0° C. or higher and 150° C. or lower. By carrying out the reaction in the above-described temperature range, molecular weight of the polysiloxane compound can be easily controlled.

Content of the polysiloxane compound in the condensation component is set so that an equivalent of condensate of the polysiloxane compound becomes 40% by mass or more and 99% by mass or less. In the present description, the equivalent of condensate of the polysiloxane compound means an amount obtained by replacing $X^1$ ($X^1$ is as defined previously regarding the general formula (1)) remaining in the polysiloxane compound to ½ of oxygen atom. The equivalent of condensate is preferably 40% by mass or more due to superior layer-forming property and trench-filling. The equivalent of condensate is more preferably 50% by mass or more, and further more preferably 55% by mass or more. On the other hand, the equivalent of condensate is preferably 99% by mass or less due to low cure shrinkage and superior crack resistance. The equivalent of condensate is more preferably 90% by mass or less, and further more preferably 85% by mass or less.

(Silica Particles)

The silica particles to be used in the present invention include, for example, fumed silica, colloidal silica, and the like.

The above-described fumed silica can be obtained by reacting a compound containing a silicon atom with oxygen and hydrogen in a gas phase. Silicon compound as a raw material includes, for example, silicon halide (for example, silicon chloride, and the like), and the like.

The above-described colloidal silica can be synthesized by sol-gel method where a compound as a raw material is subjected to hydrolytic condensation. Raw compound of the colloidal silica includes, for example, alkoxy silicon (for example, tetraethoxysilane, and the like), halogenated silane compound (for example, diphenyldichlorosilane, and the like), and the like. Among them, the colloidal silica obtained from alkoxy silicon is more preferable, because it is preferable to contain less of an impurity such as metal, halogen or the like.

Average primary particle diameter of silica particles is preferably 1 nm or more and 120 nm or less, more preferably 40 nm or less, further more preferably 20 nm or less, and most preferably 15 nm or less. The above-described average primary particle diameter of 1 nm or more is preferable due to superior crack resistance, and the average primary particle diameter of 120 nm or less is preferable due to superior trench-filling.

Average secondary particle diameter of silica particles is preferably 2 nm or more and 250 nm or less, more preferably 80 nm or less, further more preferably 40 nm or less, and most preferably 30 nm or less. The above-described average secondary particle diameter is preferably 2 nm or more due to superior crack resistance, and the average secondary particle diameter is preferably 250 nm or less due to superior trench-filling.

In addition, the average secondary particle diameter of silica particles is preferably within the above-described range as well as 0.1 to 3 times of the narrowest opening width among the trenches formed on the substrate, due to superior trench-filling, and further more preferably 0.1 to 2 times of the narrowest opening width.

The above-described average primary particle diameter is a value obtained by calculation from a specific surface area by BET, and the above-described average secondary particle diameter is a value measured using a dynamic light scattering photometer.

Shape of silica particles may be spherical, rod-like, plate-like or fiber-like, or a coalescent shape of two or more types of these shapes, and is preferably spherical. It should be noted that the term spherical here includes, in addition to true spherical, a case of almost-spherical such as spheroid and egg-shaped.

Specific surface area of silica particles is preferably 25 $m^2/g$ or more in BET specific surface area due to superior HF resistance, and more preferably 70 $m^2/g$ or more, further more preferably 140 $m^2/g$ or more, and most preferably 180 $m^2/g$ or more. The above-described BET specific surface area is a value measured by a method calculated from pressure and gas adsorption amount of $N_2$ molecule.

Silica particles are not particularly limited, so long as the silica particles conform to the above-described requirements, and commercially available product can be used.

As for the commercially available products, colloidal silica includes, for example, LEVASIL Series (produced by H. C. Starck Inc.), Methanol silica sol, IPA-ST, MEK-ST, NBA-ST, XBA-ST, DMAC-ST, ST-UP, ST-OUP, ST-20, ST-40, ST-C, ST-N, ST-O, ST-50 and ST-OL (all above, produced by Nissan Chemical Industries, Ltd.), Quartron P L series (produced by Fuso Chemical Co., Ltd.), and OSCAL series (produced by Catalysts & Chemicals Industries Co., Ltd.), and the like; powdery silica particles includes, for example, Aerosil 130, 300, 380, Aerosil TT 600 and Aerosil OX 50 (all above, produced by Nippon Aerosil Co., Ltd.), Sildex H31, H32, H51, H52, H121, and H122 (all above, Asahi Glass Co., Ltd.), E 220A and E 220 (all above, produced by Nippon Silica Industrial Co., Ltd.), SYLYSIA 470 (produced by Fuji Silysia Chemical Ltd.), and SG Flake (produced by Nippon Sheet Glass Company, Ltd.), and the like, respectively. Silica particles can also be used in a dispersed form in a dispersion solvent. Content in such case is calculated using net mass of silica particles, i.e., a value obtained from mass of dispersion solution multiplied by concentration of silica particles.

Content of silica particles in the condensation component is 1% by mass or more and 60% by mass or less. The content is preferably 1% by mass or more because low shrinkage rate and superior crack resistance are obtained. The content is more preferably 10% by mass or more, and further more preferably 15% by mass or more. On the other hand, the content is preferably 60% by mass or less due to superior layer-forming property and trench-filling. The content is more preferably 50% by mass or less, and further more preferably 45% by mass or less.

(Silane Compound)

The condensation component to be used in producing condensation reaction product of the present invention may comprise the above-described polysiloxane compound and silica particles, or comprise other component. As other component, for example, the silane compound represented by the above-described general formula (1) can be used. In this case, for example, the following two-step condensation reaction can be employed. That is, firstly polysiloxane compound and silica particles are subjected to condensation reaction by using a method where condensation reaction is carried out by adding polysiloxane compound solution to a dispersion of silica particles in a solvent, or like (first step). Subsequently, a silane compound represented by the above-described general formula (1) is further reacted to the resultant reaction solution (second step). The silane compound represented by the above-described general formula (1) to be used as a condensation component may be one kind or plural kinds. When a plurality of silane compounds are used, for example, in the above second step, the silane compounds may be added one kind by one kind sequentially into the reaction system, or a plurality of types of silane compounds may be added to the reaction system after mixing them in advance.

When the silane compound represented by the above-described general formula (1) is used as a condensation component, content of the silane compound in the condensation component is preferably set to be over 0% by mass and 40% by mass or less in equivalent of condensate of the silane compound. It should be noted that "equivalent of condensate" of the above-described silane compound means an amount obtained by replacing $X^1$ remaining in the general formula (1) to ½ of oxygen atom. The equivalent of condensate is preferably over 0% by mass due to a long pot life of the condensation reaction product solution. The equivalent of condensate is more preferably 0.01% by mass or more, and further more preferably 0.03% by mass or more. On the other hand, the equivalent of condensate is preferably 40% by mass or less due to superior crack resistance. The equivalent of condensate is more preferably 30% by mass or less, and further more preferably 20% by mass or less.

(Characteristics of Condensation Reaction Product)

When, among silica particles and silane compounds represented by the above-described general formula (1), tetrafunctional siloxane components derived from tetrafunctional silane compounds of n=0 (that is, represented by the above-describe general formula (2)) is named as Q components, each component amount of Q0 to Q4 each corresponding to siloxane bonding number of 0 to 4 can be obtained from $^{29}Si$ NMR analysis of a solution or a solid. In the present invention, a ratio of the total peak intensity (A) of all tetrafunctional siloxane components (that is, total of a component corresponding to siloxane bonding number of 0 (Q0 component), a component corresponding to siloxane bonding number of 1 (Q1 component), a component corresponding to siloxane bonding number of 2 (Q2 component), a component corresponding to siloxane bonding number of 3 (Q3 component), and a component corresponding to siloxane bonding number of 4 (Q4 component)) in the condensation reaction products to the peak intensity (B) of a component corresponding to siloxane bonding number of 4 (Q4 component) in the condensation reaction products in $^{29}Si$ NMR analysis preferably satisfies the relationship of $\{(B)/(A)\} \geq 0.50$. The above-described ratio is more preferably $\{(B)/(A)\} \geq 0.6$, and further more preferably $\{(B)/(A)\} \geq 0.7$. The above-described ratio in the above-described range is preferable, because of low cure shrinkage, superior trench-filling, and long pot life of condensation reaction product solution due to scarce terminal group such as silanol group or alkoxy group. It should be noted that the peak intensity of each Q component is calculated from peak area thereof.

The weight average molecular weight of the condensation reaction product is preferably 1,000 or more and 20,000 or less, and further more preferably 1,000 or more and 10,000 or less. The weight average molecular weight of the condensation reaction product is preferably 1,000 or more due to superior layer-forming property and crack resistance, and the weight average molecular weight is preferably 20,000 or less due to superior trench-filling and a long pot life of the condensation reaction product solution. It should be noted that the above-described weight average molecular weight is measured by a gel permeation chromatography, and is a value calculated with a standard polymethyl methacrylate equivalent. Molecular weight can be obtained, for example, by measuring 1% by mass solution of the condensation reaction product in acetone solvent, using a gel permeation chromatography (GPC), HLC-8220, TSKgel GMH$_{HR}$-M column, manufactured by Tosoh Corp., and the weight average molecular weight (Mw) as a standard polymethyl methacrylate equivalent can be determined by a differential refractometer (RI).

(Solvent)

The condensation reaction product solution of the present invention contains a solvent. Solvent includes, for example, at least one kind of solvent selected from alcohol-, ketone-, ester-, ether- and hydrocarbon-type solvent, and ester-, ether- and hydrocarbon-type solvent are more preferable. In addition, boiling point of these solvents is preferably 100° C. or higher and 200° C. or lower. Content of the solvent in the condensation reaction product solution of the present invention is preferably 100 parts by mass or more and 1900 parts by mass or less, and more preferably 150 parts by mass or more and 900 parts by mass or less based on 100 parts by mass of the condensation reaction product. The above-described content of the solvent is preferably 100 parts by mass or more due to long pot life of the condensation reaction product solution, and the content is preferably 1900 parts by mass or less due to superior trench-filling.

Specific examples of the above-described alcohol-, ketone-, ester-, ether- and hydrocarbon-type solvents includes, for example, alcohol-type solvent such as butanol, pentanol, hexanol, octanol, methoxyethanol, ethoxyethanol, propylene glycol monomethoxy ether and propylene glycol monoethoxy ether; ketone-type solvent such as methyl ethyl ketone, methyl isobutyl ketone, isoamyl ketone, ethyl hexyl ketone, cyclopentanone, cyclohexanone and γ-butyrolactone; ester-type solvent such as butyl acetate, pentyl acetate, hexyl acetate, propyl propionate, butyl propionate, pentyl propionate, hexyl propionate, propylene glycol monomethyl ether acetate and ethyl lactate; ether-type solvent such as butyl ethyl ether, butyl propyl ether, dibutyl ether, anisole, ethylene glycol dimethyl ether, ethylene glycol diethyl ether, propylene glycol dimethyl ether, propylene glycol monomethyl ether and propylene glycol diethyl ether; and hydrocarbon-type solvent such as toluene and xylene; and the like.

In the present invention, preferably one or more kinds of solvents which are selected from alcohol-, ketone-, ester-, ether- and hydrocarbon-type solvents, and have a boiling point of 100° C. or higher and 200° C. or lower constitute 50% by mass or more of all solvents contained in the condensation reaction product solution. In this case, a solvent having a boiling point of 100° C. or lower may be contained in the condensation reaction product solution. It is preferable that one or more kinds of solvents which are selected from alcohol-, ketone-, ester-, ether- and hydrocarbon-type solvents, and have a boiling point of 100° C. or higher and 200° C. or lower constitute 50% by mass or more of all solvents, because the condensation reaction product solution has a long pot life and a superior layer-forming property.

(Production of Condensation Reaction Product Solution)

Preferable production method for the above-described condensation reaction product solution of the present invention will be explained below.

Another aspect of the present invention is to provide a method for producing the above-described condensation reaction product solution of the present invention, comprising:

a first step where two or more types of silane compounds represented by the following general formula (1):

$$R^1_n SiX^1_{4-n} \quad (1)$$

{wherein n is an integer of 0 to 3, $R^1$ is hydrogen atom or a $C_{1-10}$ hydrocarbon group, $X^1$ is a halogen atom, a $C_{1-6}$ alkoxy group or acetoxy group};

containing at least a tetrafunctional silane compound corresponding to the case when n=0 in the general formula (1) and a trifunctional silane compound corresponding to the case when n=1 in the general formula (1) are subjected to hydrolytic polycondensation, to obtain polysiloxane compound; and a second step where a condensation component comprising at least 40% by mass or more and 99% by mass or less in equivalent of condensate of a polysiloxane compound obtained in the first step and 1% by mass or more and 60% by mass or less of silica particles are subjected to condensation reaction.

The solvent can be added to or present in the reaction system in any or both of the above-described first step and the above-described second step, at an arbitrary timing. In addition, after the second step, the third step where a solvent is further added can be optionally comprised. In the third step, after adding a solvent, a solvent replacement treatment where a solvent having a boiling point of 100° C. or lower and water are removed may be carried out.

In a preferred embodiment, in the above-described first step, as the silane compound represented by the general formula (1), a silane compounds of 5% by mole or more and 40% by mole or less of a tetrafunctional silane compound represented by the following general formula (2):

$$SiX^2_4 \quad (2)$$

{wherein $X^2$ is a halogen atom, a $C_{1-6}$ alkoxy group or acetoxy group};

and 60% by mole or more and 95% by mole or less of a trifunctional silane compound represented by the following general formula (3):

$$R^2 SiX^3_3 \quad (3)$$

{wherein $R^2$ is a $C_{1-10}$ hydrocarbon group, $X^3$ is a halogen atom, a $C_{1-6}$ alkoxy group, or acetoxy group}; can be used in combination.

The first step can be carried out by a technique as described in detail in the section of production of polysiloxane compound.

In the above-described second step, when the above-described polysiloxane compound and the above-described silica particles are subjected to condensation reaction, the reaction can be carried out using silica particles which are in a dispersed state in a solvent. This solvent can be water, an organic solvent, or a mixed solvent thereof. The type of a solvent which is present in the reaction system during the above-described condensation reaction varies depending on the dispersing solvent dispersing the silica particles to be used. When the dispersing solvent of silica particles to be used is an aqueous one, an aqueous dispersion obtained by adding water and/or alcohol-type solvent to silica particles may be reacted with polysiloxane compound, or water contained in the aqueous dispersion of silica particles is once replaced with an alcohol-type solvent, subsequently this alcohol-type solution dispersed of silica particles may be reacted with polysiloxane compound. An alcohol-type solvent to be used is preferably $C_{1-4}$ alcohol-type solvent, and includes, for example, methanol, ethanol, n-propanol, 2-propanol, n-butanol, methoxyethanol, and ethoxyethanol, and the like. These solvents are preferable because they can be easily mixed with water.

When dispersing solvent of silica particles to be used is a solvent such as alcohol, ketone, ester, or hydrocarbon or the like, water or a solvent such as alcohol, ether, ketone or ester or the like can be used as a solvent which is present in the reaction system at condensation reaction. Alcohol includes, for example, methanol, ethanol, n-propanol, 2-propanol, and n-butanol, and the like. Ether includes, for example, dimethoxyethane, and the like. Ketone includes, for example, acetone, methyl ethyl ketone, methyl isobutyl ketone, and the like. Ester includes, for example, methyl acetate, ethyl acetate, propyl acetate, ethyl formate, and propyl formate, and the like.

In a preferred embodiment, the second step can be carried out in an aqueous solution of $C_{1-4}$ alcohol.

When polysiloxane compound and silica particles are subjected to condensation reaction, the pH in the reaction system is adjusted preferably in a range of pH=4 to 9, more preferably in a range of pH=5 to 8, and particularly preferably in a range of pH=6 to 8. The pH in the above-described range is preferable, because the weight average molecular weight and the silanol group ratio in Q components of the condensation reaction product can be easily controlled.

The condensation reaction of polysiloxane compound and silica particles is usually carried out in the presence of an acid catalyst. The acid catalyst includes the same acid catalyst as previously described as the one to be used in the production of polysiloxane compound. In the case where an acid catalyst is removed after producing polysiloxane compound, it is usually necessary to add an acid catalyst again when polysiloxane compound and silica particles are reacted, however, in the case where polysiloxane compound is reacted with silica particles as it is without removing an acid catalyst after producing polysiloxane compound, the reaction of polysiloxane compound and silica particles can be carried out with the acid catalyst used in reacting polysiloxane compound without adding an acid catalyst again. However, in this case, an acid catalyst may be added again when polysiloxane compound and silica particles are reacted.

The reaction temperature of polysiloxane compound and silica particles is preferably 0° C. or higher and 200° C. or lower, and more preferably 50° C. or higher and 150° C. or lower. The reaction temperature in the above-described range is preferable, because the weight average molecular weight and the silanol group ratio of Q components of the condensation reaction product can be easily controlled.

In a particularly preferred embodiment, the condensation reaction of polysiloxane compound and silica particles is carried out in an aqueous solution of $C_{1-4}$ alcohol, under the condition of pH 6 to 8, at a temperature of 50° C. or higher.

When the silane compound represented by the above-described general formula (1) is used as the condensation component, in the second step, after the condensation reaction of polysiloxane compound and silica particles (the first step), the silane compound can be further reacted to the product of the condensation reaction (the second step). The silane compound may be added in neat state, or may be added after being diluted with a solvent. As a solvent for dilution, for example, alcohol-, ether-, ketone-, ester-, hydrocarbon-, or a halogenated-type solvent, etc. is used.

In the above-described second step, the concentration of the silane compound represented by the above-described general formula (1) is added to the reaction system preferably in a range of 1% by mass or more and 100% by mass or less (100% by mass in the case of neat state). The concentration is more preferably 3% by mass or more and 50% by mass or less. The concentration is preferably in the above-described range, because an amount of solvent to be used in producing condensation reaction product is scarce.

In a typical embodiment, it is preferable that in the first step, a reaction product of polysiloxane compound and silica particles is formed, subsequently in the second step, silane compound represented by the general formula (1) is added to the reaction system, and is reacted at a temperature in a range of −50° C. or higher and 200° C. or lower and for a time in a range of 1 minute or more and 100 hours or less. By controlling the reaction temperature and reaction time, viscosity of the condensation reaction product solution in the case where layer formation of the condensation reaction product is carried out can be controlled, and when the reaction temperature and reaction time are in the above-described ranges, the above-described viscosity can be controlled in a particularly suitable range for layer formation.

The pH of the reaction solution after the condensation reaction (the reaction of polysiloxane compound and silica particles, the reaction of polysiloxane compound, or the reaction of silica particles and silane compound) is preferably adjusted to in a range of 6 or more and 8 or less. The pH can be adjusted for example with an acid removal by distillation after the condensation reaction. The pH of the above-described reaction solution is preferably in the above-described range due to the long pot life of the condensation reaction product solution.

A solvent selected from alcohol-, ketone-, ester-, ether- and hydrocarbon-type solvents (preferably a solvent having a boiling point of 100° C. or higher and 200° C. or lower) may be added in the condensation (the reaction of polysiloxane compound and silica particles, or the reaction of polysiloxane compound, silica particles and silane compound) in advance, or may be added after carrying out the above-described condensation reaction by setting up a third step, or may be added in the above both timings.

When the third step is set up after forming the condensation reaction product, a solvent which is selected from alcohol-, ketone-, ester-, ether- and hydrocarbon-type solvents and has a boiling point of 100° C. or higher and 200° C. or lower may be further added to the condensate obtained by removing the solvent used in the condensation reaction by a method such as distillation.

When a solvent (in particular, organic solvent) used in the condensation reaction (the reaction of polysiloxane compound and silica particles, or the reaction of polysiloxane compound, silica particles and silane compound) in the second step, and an alcohol formed in the condensation reaction have boiling points lower than that of the solvent which is selected from a group consisting of alcohol-, ketone-, ester-, ether- and hydrocarbon-type solvents and has a boiling point of 100° C. or higher and 200° C. or lower, it is preferable that a solvent which is selected from alcohol-, ketone-, ester-, ether- and hydrocarbon-type solvents and has a boiling point of 100° C. or higher and 200° C. or lower is added during or after the condensation reaction, and after that a solvent having a lower boiling point is removed by a method such as distillation. This method is preferable because long pot life of the condensation reaction product solution can be obtained.

In a particularly preferable embodiment, in the third step, at least one or more types of solvent which are selected from a group consisting of alcohol-, ketone-, ester-, ether- and hydrocarbon-type solvents and have boiling points of 100° C. or higher and 200° C. or lower are added to the reaction solution after the condensation reaction, and then a component having a boiling point of 100° C. or lower is distilled off.

In such way, solvent replacement to a solvent having a high boiling point can be carried out. The component having a boiling point of 100° C. or lower includes, for example, water, an alcohol having a boiling point of 100° C. or lower, or the like, in the case where the first step and/or the second step are carried out in an aqueous alcohol solution, an alcohol having a boiling point of 100° C. or lower, or the like.

More specifically, in the case where water and an alcohol are used in the condensation reaction (the reaction of polysiloxane compound and silica particles, or the reaction of polysiloxane compound, silica particles and silane compound), it is preferable that a solvent is added as in the aforementioned embodiment, and then water and an alcohol having a boiling point of 100° C. or lower are removed by a method such as distillation, to reduce content of the components (that is, water and an alcohol having a boiling point of 100° C. or lower) in the condensation reaction product solution to 1% by mass or less. The content is preferably in the above-described range due to long pot life of the condensation reaction product solution.

After obtaining the condensation reaction product solution by the above-described procedures, purification may be carried out to remove an ion. Method to remove an ion includes, for example, ion exchange by an ion-exchange resin, ultrafiltration, and distillation, and the like.

A preferred embodiment of the present invention is to provide a method for producing the condensation reaction product solution of the present invention, comprising:

a first step where silane compounds composed of 5% by mole or more and 40% by mole or less of tetrafunctional silane compounds represented by the following general formula (2):

$$SiX^2{}_4 \quad (2)$$

{wherein $X^2$ is a halogen atom, a $C_{1-6}$ alkoxy group, or acetoxy group};
and 60% by mole or more and 95% by mole or less of trifunctional silane compounds represented by the following general formula (3):

$$R^2SiX^3{}_3 \quad (3)$$

{wherein $R^2$ is $C_{1-10}$ hydrocarbon group, $X^3$ is a halogen atom, a $C_{1-6}$ alkoxy group, or acetoxy group};
are subjected to hydrolytic polycondensation in an aqueous alcohol solution under weak acidic condition of pH 5 or higher and lower than 7 to obtain polysiloxane compound;

a second step where a condensation component composed of 40% by mass or more and 99% by mass or less in equivalent of condensate of a polysiloxane compound obtained in the first step and 1% by mass or more and 60% by mass or less of silica particles are subjected to condensation reaction, in an aqueous solution of a $C_{1-4}$ alcohol, under the condition of pH 6 to 8, at a temperature of 50° C. or higher, to obtain a reaction solution; and a third step where at least one kind of solvent having a boiling point of 100° C. or higher and 200° C. or lower selected from a group consisting of alcohol, ketone, ester, ether and hydrocarbon-based solvent is added to the reaction solution obtained in the second step, then components having a boiling point of 100° C. or lower are removed by distillation, to obtain a condensation reaction product solution.

(Characteristics of Condensation Reaction Product Solution)

In order to fill a trench having a narrow opening width and a high aspect ratio with the condensation reaction product solution, it is preferable that the condensation reaction product solution has a low fluidity. In the present invention, a degree of low fluidity is evaluated by a viscosity of the condensation reaction product solution in solid content concentration of 50% by mass at 25° C.

In the present description, solid content concentration of the condensation reaction product solution means a concentration of compounds having Si atom present in the solution. The solid content concentration can be measured by a method where weights of the condensation reaction product solution before and after curing in the nitrogen atmosphere at 600° C. are measured. In addition, viscosity value at 25° C. means a value measured by using an E type viscometer when viscosity value is stabilized (variation is 2% or less). In the present invention, viscosity of the above-described condensation reaction product solution in a solid content concentration of 50% by mass at 25° C. is preferably 500 mPa·s or less. The viscosity is more preferably 200 mPa·s or less, further more preferably 100 mPa·s or less, and particularly preferably 70 mPa·s or less. The viscosity is preferably in the above-described range due to superior trench-filling. For example, in the case of a trench having an opening width of 25 nm or less and an aspect ratio of 40 or more, the above-described viscosity is preferably 70 mPa·s or less.

The condensation reaction product solution of the present invention is suitably used, for example, for use to fill a trench formed on a semiconductor device.

<Method for Forming Insulating Layer>

Another embodiment of the present invention is to provide a method for forming an insulating layer comprising a coating step where the above-described condensation reaction product solution of the present invention is coated on a substrate to obtain a coated substrate, and a curing step where the coated substrate obtained in the coating step is heated. The condensation reaction product solution produced by the method as described above can be coated on a substrate by usual method. Coating method includes, for example, spin coating method, dip coating method, roller blade coating method, and spray coating method, and the like. Among them, a spin coating method is preferable because a coated thickness in layer formation is uniform.

The above-described substrate includes, for example, silicon (Si) substrate. In addition, the above-described substrate can have a trench structure. In the coating step, when the condensation reaction product solution is coated on a substrate having a trench structure, for example, by spin coating method, coating may be carried out either in a single stage or in multiple stages using different rotational speeds in combination. In particular, it is preferable that at least the first stage is carried out at a low speed, and the second stage or later is carried out at a high speed. This is because of the following reasons, i.e., by rotating at a low speed in the first stage, the condensation reaction product can be spread in the whole area of substrate (for example, silicon substrate), and superior trench-filling can be obtained. In addition, number of coating of the condensation reaction product may be either one time or plural times, but one time coating is more preferable due to superior layer-forming property and lower production cost. For example, the coated substrate can be obtained by the procedures as described above.

Subsequently, the above-described coated substrate is heated in the curing step. After coating the condensation reaction product solution on a substrate by the above-described method in the coating step, the coated substrate is preferably subjected to pre-baking at a temperature in a range of 50° C. to 200° C. to remove the solvent remaining in the coated layer. In this time, temperature may be increased in a stepwise manner or continuously. Atmosphere in the pre-baking may be oxidative atmosphere or non-oxidative atmosphere.

Subsequently, by heat-curing the layer obtained by pre-curing, the insulating layer can be obtained. As a method of the above-described heat-curing, a general heating means such as hot plate, oven and furnace can be employed. The heat-curing is preferably carried out in non-oxidative atmosphere. In addition, heating temperature is preferably over 200° C. and 850° C. or lower, more preferably over 300° C. and 800° C. or lower, and further more preferably over 350° C. and 750° C. or lower. Heating temperature is preferably over 200° C. because superior layer quality can be obtained, and heating temperature is preferably 850° C. or lower due to superior crack resistance.

Non-oxidative atmosphere means under vacuum or an inert atmosphere such as $N_2$, Ar and Xe. Concentration of oxidative gas such as oxygen and steam in these inert atmospheres is preferably 1000 ppm or less, more preferably 100 ppm or less, and further more preferably 10 ppm or less. Total pressure of the non-oxidative atmosphere is not particularly limited, and either of pressurized state, normal pressure or reduced pressure is acceptable.

In a high temperature region of 700° C. or higher and 900° C. or lower, the above-described curing step is preferably carried out in a gas containing hydrogen. The gas containing hydrogen to be used in the curing step may be introduced from the beginning of the curing step, that is, from the time point when a substrate is still at a temperature of 700° C. or lower, or after a substrate reaches 700° C. Further, the curing step may be carried out in two stages where after first heating is once carried out at a temperature of 700° C. or higher and 900° C. or lower in a gas not containing hydrogen, second heating is carried out by introducing a gas containing hydrogen. In any method, until the substrate is cooled down to a temperature of 400° C. or lower, preferably around room temperature after curing is completed, the gas containing hydrogen is preferably kept introduced.

As mentioned above, when the curing step is carried out in a gas containing hydrogen, even if a chemical bond between a silicon atom and an organic group is broken at a high temperature exceeding 700° C., since the generated dangling-bond can be terminated with hydrogen, formation of silanol group can be prevented.

Heat treatment time in the curing step is preferably 1 minute or longer and 24 hours or shorter, and more preferably 30 minutes or longer and 2 hours or shorter.

In the curing step, heat-curing in an oxidative atmosphere may be carried out in combination with photochemical treatment. When heat treatment and photochemical treatment are carried out concurrently, temperature is preferably 20° C. or higher and 600° C. or lower, and treatment time is preferably 0.1 minute or longer and 120 minutes or shorter. In the photochemical treatment, visible light, ultraviolet ray, and far-ultraviolet ray, and the like can be used. Also for photochemical treatment, low-pressure or high-pressure mercury lamp; deuterium lamp; discharge light from rare gas such as argon, krypton and xenon; excimer laser such as YAG laser, argon laser, carbon dioxide laser, XeF, XeCl, XeBr, KrF, KrCl, ArF and ArCl; and the like can be used as a light source. Output of these light sources is preferably 10 to 5,000 W. Wavelength of the light by these light sources is not particularly limited, so long as the condensation reaction product in the layer coated on a substrate has absorption at the wavelength even in a small degree, but preferably light having a wavelength of 170 to 600 nm. Irradiation amount is preferably 0.1 to 1,000 $J/cm^2$, and more preferably 1 to 100 $J/cm^2$. Ozone may be generated during photochemical treatment concurrently. For example, by subjecting to the photochemical treatment under the above-described conditions, oxidation reaction of the condensation reaction product in the layer coated on a substrate is facilitated and layer quality after curing can be improved.

After the above-described curing step, the surface of insulating layer may be exposed to a hydrophobizing agent. By exposing to a hydrophobizing agent, the silanol group in the insulating layer formed in the above-described curing step is reacted with the hydrophobizing agent, and the surface of insulating layer can be hydrophobized.

Known hydrophobizing agent can be used, for example, hexamethyldisilazane, diacetoxydisilazane, dihydroxydimethylsilane, and halogenized organic silane, and the like can be utilized. In addition, cyclic siloxane, organic silicon compound and cyclic silazane can be utilized.

Specific example of cyclic siloxane includes, for example, (3,3,3-trifluoropropyl)methylcyclotrisiloxane, triphenyltrimethylcyclotrisiloxane, 1,3,5,7-tetramethylcyclotetrasiloxane, octamethylcyclotetrasiloxane, 1,3,5,7-tetramethyl-1,3,5,7-tetraphenylcyclotetrasiloxane, tetraethylcyclotetrasiloxane, and pentamethylcyclopentasiloxane, and the like.

Specific example of organic silicon compound includes, for example, siloxane compound such as 1,2-bis(tetramethyldisiloxanyl)ethane, 1,3-bis(trimethylsiloxy)-1,3-dimethyldisiloxane, 1,1,3,3-tetraisopropyldisiloxane, 1,1,3,3-tetramethyldisiloxane, 1,1,3,3-tetraethyldisiloxane, 1,1,3,3-tetraphenyldisiloxane, 1,1,4,4-tetramethyldisilylethylene, 1,1,3,3,5,5-hexamethyltrisiloxane, 1,1,3,3,5,5-hexaethyltrisiloxane, 1,1,3,3,5,5-hexaisopropyltrisiloxane, 1,1,3,3,5,5,7,7-octamethyltetrasiloxane, 1,1,1,3,5,5-hexamethyltrisiloxane, 1,1,1,3,3,5,7,7-octamethyltetrasiloxane, 1,3-dimethyltetramethoxydisiloxane, 1,1,3,3-tetramethyl-1,3-diethoxydisiloxane, 1,1,3,3,5,5-hexamethyldiethoxytrisiloxane and tetramethyl-1,3-dimethoxydisiloxane.

Specific example of cyclic silazane includes, for example, cyclic silazane compound such as 1,2,3,4,5,6-hexamethylcyclotrisilazane, 1,3,5,7-tetraethyl-2,4,6,8-tetramethylcyclotetrasilazane and 1,2,3-triethyl-2,4,6-triethylcyclotrisilazane.

These hydrophobizing agents can be used alone or in combination of two or more kinds.

As a method for exposing the surface of insulating layer to a hydrophobizing agent, a method where a hydrophobizing agent is coated on the surface of insulating layer in a liquid phase; a method where a hydrophobizing agent in gas phase is brought into contact with the surface of insulating layer, or the like can be employed.

When a hydrorphobizing agent is coated on the surface of insulating layer in a liquid phase, a hydrophobizing agent and an organic solvent may be used in combination. A preferred embodiment includes a case where an organic silicon compound is coated on the surface of insulating layer in a liquid phase by combining with an organic solvent.

When a combination of an organic silicon compound and an organic solvent is used, concentration of the organic silicon compound is not particularly limited, and an arbitrary concentration can be used. When coating in a liquid phase is employed, temperature and time are not particularly limited, but preferably 0° C. or higher and 100° C. or lower, and more preferably 20° C. or higher and 80° C. or lower, and preferably 0.1 minute or longer and 30 minutes or shorter, and more preferably 0.2 minute or longer and 10 minutes or shorter.

When, in a gas phase, a hydrophobizing agent is brought into contact with the surface of insulating layer, the hydrophobizing agent is used preferably in a diluted state with a gas. A gas for dilution includes air, nitrogen, argon, and hydrogen, and the like. In addition, instead of dilution with a gas, contact under reduced pressure is also possible. When, in a gas phase, a hydrophobizing agent is brought into contact with the surface of insulating layer, temperature and time are not particularly limited, but preferably 0° C. or higher and 500° C. or lower, and more preferably 20° C. or higher and 400° C. or lower, and preferably 0.1 minute or longer and 30 minutes or shorter, and more preferably 0.2 minute or longer and 10 minutes or shorter.

Before the surface of insulating layer is exposed to a hydrophobizing agent, dehydration treatment of the insulating layer is preferably carried out. Dehydration treatment can be carried out by subjecting the insulating layer to a heat treatment in dry air or under inert atmosphere. Temperature of heat treatment is preferably 250° C. or higher and 850° C. or lower, and more preferably 300° C. or higher and 850° C. or lower. Time of heat treatment is preferably 0.1 minute or longer and 2 hours or shorter, and more preferably 0.2 minute or longer and 1 hour or shorter. When the above-described temperature is 250° C. or higher, moisture adsorbed on the insulating layer can be well removed.

As explained above, the present inventors invented a condensation reaction product solution having long pot life, superior trench-filling when used for filling a trench, low cure shrinkage when converted to silicon oxide by curing, as well as superior crack resistance and HF resistance, by optimizing ratio of silica particles to polysiloxane compound and ratio of polysiloxane compound components. That is, in a particularly preferred embodiment, it is preferable that the condensation component to be used in the present invention comprise 50% by mass or more and 90% by mass or less in equivalent of condensate of polysiloxane compound and 10% by mass or more and 50% by mass or less of silica particles. The above-described ratio is preferably 10% by mass or more due to low shrinkage rate and superior crack resistance, and the ratio is preferably 50% by mass or less due to superior layer-forming property and trench-filling. In addition, it is particularly preferable that polysiloxane compound is composed of 10% by mole or more and 40% by mole or less of a component derived from a tetrafunctional silane compound represented by the above-described general formula (2) and 60% by mole or more and 90% by mole or less of a component derived from a trifunctional silane compound represented by the above-described general formula (3). The ratio of a component derived from a trifunctional silane compound is preferably 60% by mole or more due to superior HF resistance, crack resistance and trench-filling, and the ratio is preferably 90% by mole or less due to superior layer-forming property and adhesion to substrate.

An insulating layer obtained by using the condensation reaction product solution of the present invention is suitable for interlayer insulating layer, element isolating layer, insulating layer for STI (Shallow Trench Isolation), PMD (Pre Metal Dielectric) layer, flattening layer, surface protecting layer, sealing layer, and the like for electronic parts such as liquid crystal display element, integrated circuit element, semiconductor memory element and solid-state image sensing device.

Hereinafter, embodiments of the present invention are explained in more detail by means of Examples and Comparative Examples. The present invention is not limited to these Examples.

[Evaluation Items of Polysiloxane Compound, Condensation Reaction Product and Condensation Reaction Product Solution]

(1) NMR Measurement of Condensation Reaction Product (Measurement of the Amount of Q4 Component)

Sample adjustment: Sample adjustment was carried out by adding chromium acetylacetonate (0.9% by mass) to a 25% by mass (in solid content concentration in the experiment) condensation reaction product solution in deuterated acetone.

Measurement conditions: Measurement was made using a nuclear magnetic resonance (NMR) equipment: ECA700 with a probe SI10, manufactured by JEOL Ltd., and integration was carried out at a waiting time of 120 seconds and integrations of 512 times.

Peak analysis: Using a perk area of each Q component, an amount of Q4 was calculated from the peak intensity (A) of all tetrafunctional siloxane components in the condensation reaction product and the peak intensity (B) of a component corresponding to siloxane bonding number of 4 (that is, Q4 component), according to the following formula:

$$\text{Amount of } Q4 = \{(B)/(A)\} \times 100(\%).$$

(2) Measurement of Weight Average Molecular Weight (Mw) of Condensation Reaction Product A gel permeation chromatography (GPC) equipment: HLC-8220, and a column: TSKgel GMHHR-M, both manufactured by Tosoh Corp. were used. Measurement was made in a 1% by mass condensation reaction product solution in acetone, and the weight average molecular weight (Mw) converted to standard polymethyl methacrylate was determined by a refractive index detector (RI).

(3) pH Measurement of Condensation Reaction Product Solution

To a 20% by mass in solid content concentration of condensation reaction product solution, an equivalent amount (based on mass) of water was added, and the mixture was stirred, and the pH was measured by contacting this mixed solution to a pH-test paper.

(4) Measurement of Water Amount in Condensation Reaction Product Solution

Content of water in a 20% by mass in solid content concentration of condensation reaction product solution was determined using a gas chromatograph (GC-14B) and TCD detector by the internal calibration curve method.

(5) Measurement of Alcohol Amount in Condensation Reaction Product Solution

Content of alcohol in a 20% by mass in solid content concentration of condensation reaction product solution was obtained using a gas chromatograph (GC-14B) and TCD detector by the internal calibration curve method.

(6) Viscosity Measurement of 50% by Mass in Solid Content Concentration of Condensation Reaction Product Solution A condensation reaction product solution having a known concentration was concentrated to 50% by mass in solid content concentration by using an evaporator, and viscosity measurement was carried out within 5 minutes after a temperature of the condensation reaction product solution after concentration became 25° C. or lower. A 50% by mass in solid content concentration of sample (1.1 ml) was placed in the sample cup of the viscometer (E type viscometer (model RE-85R) manufactured by Toki Sangyo Co., Ltd., corn rotor: 1°34'×R24), and rotor was rotated at an appropriate number of revolution. A value when viscosity value was stabilized (when variation became 2% or less) was obtained.

(7) Pot Life of Condensation Reaction Product Solution

After a condensation reaction product solution stood at room temperature for 2 weeks, the presence or absence of gelation was visually observed. Pot life was ranked according to the following criteria: a case where gelation was observed is B, and a case where not observed is A.

[Item of Layer Evaluation]

(8) Layer-Forming Property

After condensation reaction product layer was formed on a Si substrate, the layer was pre-baked at 100° C. for 2 minutes, and then at 140° C. for 5 minutes on a hot plate in a stepwise fashion. After that, the surface of the layer was observed by an optical microscope. The layer was ranked according to the following criteria: a case where a striation or a comet was observed is B, and a case where not observed is A.

(9) Crack Resistance

After condensation reaction product layers were formed in various thicknesses on a Si substrate, the layers were pre-baked at 100° C. for 2 minutes, and then at 140° C. for 5 minutes on a hot plate in a stepwise fashion. Subsequently, the layers were cured at 700° C. under the $N_2$ atmosphere, and the surface of layers after curing was observed by using an optical microscope. It was judged whether the layer had been cracked or not by an optical microscope. The layers were ranked depending on a crack limit layer thickness according to the following criteria: less than 0.8 μm is B, 0.8 μm or more and less than 1.0 μm is A, 1.0 μm or more and less than 1.5 μm is AA, and 1.5 μm or more is AAA.

(10) Shrinkage Rate

After condensation reaction product layer was formed on a Si substrate, the layer was pre-baked at 100° C. for 2 minutes, and then at 140° C. for 5 minutes on a hot plate in a stepwise fashion. Subsequently, the layer was cured at 700° C. under the atmosphere of 10 ppm or lower of oxygen concentration. Each thickness of the layer before and after the curing which was named T1 or T2 was measured using a spectroscopic ellipsometer, M-2000U-Xe, manufactured by J. A. Woollam Co., Inc. Shrinkage rate was obtained from the layer thicknesses before and after curing according to the following formula:

Shrinkage rate=$(1-T_2/T_1) \times 100$(%).

The layer was ranked according to the following criteria: a case where shrinkage rate was 15% or more is B, a case where shrinkage rate was 12% or more and less than 15% is A, a case where shrinkage rate was 8% or more and less than 12% is AA, and a case where shrinkage rate was less than 8% is AAA.

(11) HF Resistance

The procedures until the curing at 700° C. under the atmosphere of 10 ppm or lower of oxygen concentration were carried out in the same manner as in the above item (10). The layer after curing was dipped in an aqueous HF solution having a mass ratio of HF:water=1:299 for 10 minutes, and the layer thicknesses before and after the HF test were measured using a spectroscopic ellipsometer. HF resistance was ranked depending on HF rate which was a dissolution speed of the layer on Si substrate and variation of refractive index after the HF dipping, according to the following criteria: a case where HF rate was 50 nm/min or more and variation of refractive index was 0.01 or more is B, a case where the HF rate was less than 50 nm/min and variation of refractive index was 0.01 or more is A, and a case where the HF rate was less than 10 nm/min and variation of refractive index was less than 0.01 is AA.

(12) Adhesive Property

The procedures until the curing at 700° C. under the atmosphere of 10 ppm or lower of oxygen concentration were carried out in the same manner as in the above item (10). On the layer after curing, 6 cuts were made at 1 mm intervals in both directions of grid pattern using a cutter to form 25 lattice patterns of 1 mm×1 mm. A transparent pressure-sensitive adhesive tape was adhered thereto, and then the tape was peeled off. After that, the lattice pattern was observed, and the adhesive property was ranked according to the following criteria: a case where all of 25 lattices were not peeled off is AA, a case where 1 to 4 lattices were peeled off is A, and a case where 5 or more lattices were peeled off is B.

(13) Trench-Filling

After a condensation reaction product layer was formed on a Si substrate having a trench having an opening width of 20 nm and a depth of 1 μm (that is, aspect ratio of 50), the layer was pre-baked at 100° C. for 2 minutes and then at 140° C. for 5 minutes on a hot plate in a stepwise fashion. Subsequently, the layer was cured at 700° C. under the atmosphere of 10 ppm or lower of oxygen concentration. After the curing, the Si substrate having a trench was fractured and FIB-processed, and then observed by using a scanning electron microscope (SEM) S4800 manufactured by Hitachi Ltd. at 1 kV of acceleration voltage. In one fractured substrate, the trench part was observed at 1000 positions. Trench-filling was ranked according to the following criteria: a case where there was no void or no seam at all positions and the trench was filled is AAA, a case where 10 or less of trenches had a void or a seam is AA, a case where 10 or more and 100 or less of trenches had a void or a seam is A, and a case where more than 100 trenches had a void or a seam is B.

PRODUCTION EXAMPLE OF POLYSILOXANE COMPOUND

Production Example 1

Into a recovery flask, methyltrimethoxysilane (MTMS) (11.6 g), tetraethoxysilane (TEOS) (4.4 g), and ethanol (20 g) were poured, and the mixture was stirred. A mixed aqueous solution of water (11.5 g) and concentrated nitric acid (an appropriate amount) for pH adjustment was added dropwise thereto, to adjust the pH to 6 to 7. After completion of the dropwise addition, the mixture was stirred for 30 minutes, and then allowed to stand for 24 hours.

Production Example 2 to Production Example 14

Syntheses were carried out in the same manner as in Production Example 1, except that the raw materials described in Table 1 were used.

Production of the condensation reaction product of the polysiloxane compound and silica particles.

Hereinafter, are examples of obtaining a condensation reaction product by reacting the polysiloxane compound prepared in Production Examples 1 to 14 and silica particles.

In each Example and Comparative Example, condensation reaction products having various composition ratio were obtained by varying ratio of equivalent of condensate of the polysiloxane compound and amount to be charged of silica particles. It should be noted that amount of the silica particles in Table 2 is based on the total mass of a equivalent of condensate of polysiloxane compound and an amount of silica particles.

Example 1

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (47.6 g) and ethanol (80 g) were poured, and the mixture was stirred for 5 minutes. The polysiloxan compound synthesized in Production Example 1 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA. For the resultant condensation reaction product solution, evaluations of characteristics shown in the above-described items (1) to (7) were carried out. Results of the evaluations are shown in Table 3. A $^{29}$Si NMR spectrum is shown in FIG. 1.

The resultant condensation reaction product solution (2 mL) was dropped on a 6 inches Si substrate, and spin coating was carried out in two stages at a rotation speed of 300 rpm for 10 seconds and then at 1000 rpm for 30 seconds. This substrate was pre-baked in air at 100° C. for 2 minutes, and then at 140° C. for 5 minutes in a stepwise manner on a hot plate, to remove the solvent. The resultant Si substrate was heated up to 700° C. at a rate of 5° C./min under the atmosphere of 10 ppm or less of oxygen concentration, and cured at 700° C. for 30 minutes, and then cooled down to room temperature at a rate of 2° C./rain.

For the Si substrate after curing, evaluations shown in the above-described items (8) to (12) were carried out. Results of the evaluations are shown in Table 4.

In addition, the resultant condensation reaction product solution (2 mL) was dropped on a Si substrate having a trench structure of an opening width of 20 nm and a depth of 1 μm, and spin coating, pre-baked and curing were carried out under the above-described conditions. Results of trench-filling are shown in Table 4

Example 2

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (63.5 g) and ethanol (80 g) were poured, and the mixture was stirred for 5 minutes. The polysiloxane compound synthesized in Production Example 2 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Example 3

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (63.5 g) and ethanol (80 g) were poured, and the mixture was stirred for 5 minutes. The polysiloxan compound synthesized in Production Example 3 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Example 4

Into a 500 mL four-necked flask equipped with a distillation column and a dropping funnel, PL-1 (12% by mass of silica particles dispersion in water with an average primary particle diameter of 15 nm, produced by Fuso Chemical Co., Ltd.) (33.3 g) and ethanol (80 g) were poured, and the mixture was stirred for 5 minutes. The polysiloxane compound synthesized in Production Example 4 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Example 5

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (23.8 g) and ethanol (80 g) were poured, and the mixture was stirred for 5 minutes. The polysiloxane compound synthesized in Production Example 5 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Example 6

Into a 500 mL four-necked flask equipped with a distillation column and a dropping funnel, PL-1 (12% by mass of silica particles dispersion in water with an average primary particle diameter of 15 nm, produced by Fuso Chemical Co., Ltd.) (41.7 g) and ethanol (80 g) were poured, and the mixture was stirred for 5 minutes. The polysiloxane compound synthesized in Production Example 6 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Example 7

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (15.9 g) and ethanol (80 g) were poured, and the mixture was stirred for 5 minutes. The polysiloxane compound synthesized in Production Example 7 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Example 8

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (47.6 g) and ethanol (80 g) were poured, and the mixture was stirred for 5 minutes. The polysiloxane compound synthesized in Production Example 8 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Example 9

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (47.6 g) and ethanol (80 g) were poured, and the mixture was stirred for 5 minutes. The polysiloxane compound synthesized in Production Example 9 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Comparative Example 1

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (47.6 g) and ethanol (80 g) were poured, and the mixture was stirred for 5 minutes. The polysiloxane compound synthesized in Production Example 10 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Comparative Example 2

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (127 g) and ethanol (80 g) were poured, and the mixture was stirred for 5 minutes. The polysiloxane compound synthesized in Production Example 11 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Comparative Example 3

To the polysiloxane compound synthesized in Production Example 12, propylene glycol methyl ethyl acetate (PGMEA) (50 g) was added. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

Figure 2:
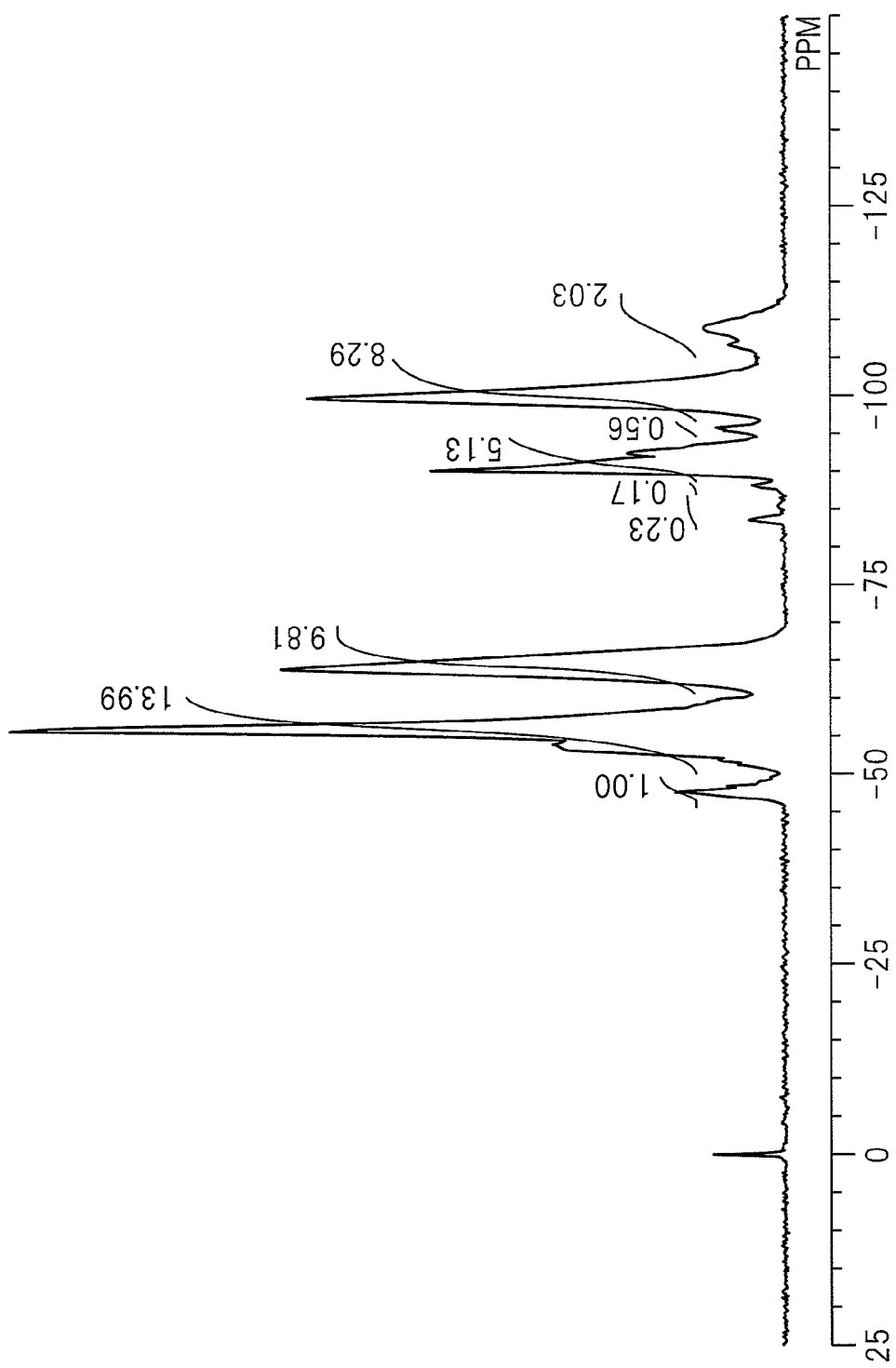
[FIG. 2]

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4. A $^{29}$Si NMR spectrum is shown in FIG. 2.

Comparative Example 4

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (47.6 g) and ethanol (80 g) were poured, and the mixture was stirred for 5 minutes. The polysiloxane compound synthesized in Production Example 13 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Comparative Example 5

Into a 500 mL four-necked flask equipped with a distillation column and a dropping funnel, PL-06L (6.3% by mass of silica particles dispersion in water with an average primary particle diameter of 6 nm, produced by Fuso Chemical Co., Ltd.) (127 g) and ethanol (80 g) were poured, and the mixture was stirred for 5 minutes. The polysiloxane compound synthesized in Production Example 14 was added dropwise thereto at room temperature. After completion of the dropwise addition, the mixture was stirred for 30 minutes, and then refluxed for 4 hours. After the reflux, propylene glycol methyl ethyl acetate (PGMEA) (150 g) was added thereto. By raising the temperature of the oil bath, methanol, ethanol, water and nitric acid were distilled off through the distillation line, to obtain a condensation reaction product solution in PGMEA. The condensation reaction product solution in PGMEA was concentrated to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Comparative Example 6

Into a 500 mL recovery flask, methyltrimethoxysilane (11.6 g), tetraethoxysilane (4.4 g), and ethanol (20 g) were poured, and the mixture was stirred for 5 minutes. After that, PL-06L (6.3% by mass of silica particles dispersion in water with an average primary particle diameter of 6 nm, produced by Fuso Chemical Co., Ltd.) (47.6 g) was added, and the mixture was stirred for 1 minute. Concentrated nitric acid (10 µl) was added dropwise thereto, and the mixture was stirred for 30 minutes. By concentration and addition of ethanol, a concentration was adjusted, and a 20% by mass in solid content concentration of solution in ethanol was obtained.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

Comparative Example 7

Into a 500 mL four-necked flask equipped with a distillation column and a dropping funnel, methyltrimethoxysilane (11.6 g), tetraethoxysilane (4.4 g), and PGMEA (20 g) were poured, and the mixture was stirred for 5 minutes. After that, temperature of the solution was set at 50° C., and a mixed solution of water (11.5 g) and concentrated nitric acid (10 µl) was added dropwise thereto. Subsequently, after the solution was stirred at 50° C. for 3 hours, PGMEA (50 g) was added thereto. After that, by raising the temperature of the oil bath, ethanol, water and nitric acid were distilled off through the distillation line, to obtain a condensation reaction product solution in PGMEA. Subsequently, the resultant polysiloxane compound solution in PGMEA and silica particles dispersion in PGMEA which was obtained by substituting isopropanol of AD-1003 (20% by mass of silica particles dispersion in isopropanol with an average particle diameter of 7 nm, produced by Catalysts & Chemicals Industries Co., Ltd.) (15 g) by PGMEA were mixed and stirred for 5 minutes, to obtain a 20% by mass in solid content concentration of solution in PGMEA.

For the resultant condensation reaction product solution, evaluations of characteristics shown in the above-described items (1) to (7) were carried out. Results of the evaluations are shown in Table 3. In addition, layer-forming, curing and trench-filling were carried out under the same conditions as in Example 1. Results of the evaluations are shown in Table 4.

TABLE 1

| | Methyltri-methoxysilane (g) | Tetraethoxy-silane (g) | Ethanol (g) | Water (g) |
|---|---|---|---|---|
| Production Example 1 | 11.6 | 4.4 | 20 | 11.5 |
| Production Example 2 | 10.0 | 3.8 | 20 | 9.8 |
| Production Example 3 | 11.1 | 1.9 | 20 | 9.4 |
| Production Example 4 | 7.6 | 7.8 | 20 | 10.7 |
| Production Example 5 | 14.1 | 5.4 | 20 | 13.9 |
| Production Example 6 | 8.3 | 3.2 | 20 | 8.2 |
| Production Example 7 | 13.2 | 8.7 | 20 | 15.4 |
| Production Example 8 | 13.6 | 1.1 | 20 | 10.8 |
| Production Example 9 | 12.9 | 2.2 | 20 | 8.8 |
| Production Example 10 | 0.0 | 24.3 | 20 | 15.7 |

TABLE 1-continued

| | Methyltri-methoxysilane (g) | Tetraethoxy-silane (g) | Ethanol (g) | Water (g) |
|---|---|---|---|---|
| Production Example 11 | 2.5 | 2.6 | 20 | 3.6 |
| Production Example 12 | 16.6 | 6.4 | 20 | 16.4 |
| Production Example 13 | 14.2 | 0.0 | 20 | 10.5 |
| Production Example 14 | 4.1 | 0.0 | 20 | 3.0 |

TABLE 2

| | | Polysiloxane compound | | Amount of silica particles | | |
|---|---|---|---|---|---|---|
| | No. | MTMS (mol %) | TEOS (mol %) | PL-06 (% by mass) | PL-1 (% by mass) | AD 1003 (% by mass) |
| Example | 1 | 80 | 20 | 30 | | |
| | 2 | 80 | 20 | 40 | | |
| | 3 | 90 | 10 | 40 | | |
| | 4 | 60 | 40 | | 40 | |
| | 5 | 80 | 20 | 15 | | |
| | 6 | 80 | 20 | | 50 | |
| | 7 | 70 | 30 | 10 | | |
| | 8 | 95 | 5 | 30 | | |
| | 9 | 90 | 10 | 30 | | |
| Comparative Example | 1 | 0 | 100 | 30 | | |
| | 2 | 60 | 40 | 80 | | |
| | 3 | 80 | 20 | | | |
| | 4 | 100 | 0 | 30 | | |
| | 5 | 100 | 0 | 80 | | |
| | 6 | 80 | 20 | 30 | | |
| | 7 | 80 | 20 | | | 30 |

TABLE 3

Evaluation items of polysiloxane compound, condensation reaction product and condensation reaction product solution

| | No. | Content of Q4 (%) | Mw | pH | Water amount (% by mass) | Alcohol amount (% by mass) | Viscosity (mPa·s) | Pot life |
|---|---|---|---|---|---|---|---|---|
| Example | 1 | 74 | 2,700 | 6.5 | 0.08 | 0.04 | 56 | AA |
| | 2 | 69 | 3,300 | 6.5 | 0.09 | 0.02 | 83 | AA |
| | 3 | 81 | 3,000 | 6.5 | 0.10 | 0.08 | 74 | AA |
| | 4 | 52 | 4,500 | 6.5 | 0.06 | 0.03 | 138 | AA |
| | 5 | 76 | 3,200 | 6.5 | 0.08 | 0.04 | 61 | AA |
| | 6 | 65 | 5,200 | 6.5 | 0.04 | 0.03 | 86 | AA |
| | 7 | 63 | 2,800 | 6.5 | 0.10 | 0.09 | 72 | AA |
| | 8 | 92 | 2,200 | 6.5 | 0.09 | 0.08 | 48 | AA |
| | 9 | 85 | 2,800 | 6.5 | 0.08 | 0.07 | 52 | AA |
| Comparative Example | 1 | 15 | 60,000 | 6.5 | 0.07 | 0.07 | Unmeasurable | B |
| | 2 | 21 | 15,000 | 6.5 | 0.10 | 0.09 | Unmeasurable | B |
| | 3 | 12 | 2,500 | 6.5 | 0.06 | 0.05 | 35 | AA |
| | 4 | 95 | 2,300 | 6.5 | 0.07 | 0.04 | 44 | AA |
| | 5 | 85 | 3,300 | 6.5 | 0.12 | 0.09 | Unmeasurable | AA |
| | 6 | 38 | 40,000 | 2 | 32.41 | 48.08 | Unmeasurable | B |
| | 7 | 45 | 1,500 | 6.5 | 0.07 | 0.03 | Unmeasurable | B |

TABLE 4

| | No. | Layer-forming property | Crack resistance | Shrinkage rate | HF resistance | Adhesive property | Trench-filling |
|---|---|---|---|---|---|---|---|
| Example | 1 | AA | AAA | AAA | AA | AA | AAA |
| | 2 | AA | AAA | AAA | AA | AA | AA |
| | 3 | AA | AAA | AAA | AA | AA | AA |
| | 4 | AA | AA | AAA | AA | AA | A |
| | 5 | AA | AA | A | AA | AA | AAA |
| | 6 | AA | AA | AAA | AA | A | A |
| | 7 | AA | AA | A | AA | AA | AA |
| | 8 | AA | AAA | AAA | AA | A | AAA |
| | 9 | AA | AAA | AAA | AA | AA | AAA |
| Comparative Example | 1 | AA | B | A | B | AA | B |
| | 2 | AA | B | AAA | B | B | B |
| | 3 | AA | A | B | AA | AA | AAA |
| | 4 | B | AAA | AAA | AA | B | AAA |
| | 5 | B | B | AAA | B | B | B |
| | 6 | AA | B | B | AA | AA | B |
| | 7 | AA | B | B | AA | B | B |

Industrial Applicability

The insulating layer obtained by using the condensation reaction product solution of the present invention is suitable for interlayer insulating layer, element isolating layer, insulating layer for STI (Shallow Trench Isolation), PMD (Pre Metal Dielectric) layer, flattening layer, surface protecting layer, sealing layer, and the like for electronic parts such as liquid crystal display element, integrated circuit element, semiconductor memory element and solid-state image sensing device and the like.

The invention claimed is:

1. A condensation reaction product solution comprising:
(I) a condensation reaction product obtained by condensation reaction from a condensation component containing at least (i) 40% by mass or more and 99% by mass or less in equivalent of condensate of a polysiloxane compound which is a polycondensate of silane compounds represented by the following general formula (1):

$$R^1{}_n SiX^1{}_{4-n} \quad (1)$$

{wherein n is an integer of 0 to 3, $R^1$ is hydrogen atom or a $C_{1-10}$ hydrocarbon group, $X^1$ is a halogen atom, a $C_{1-6}$ alkoxy group or acetoxy group}; and (ii) 1% by mass or more and 60% by mass or less of silica particles; and
(II) a solvent;
wherein said silane compounds represented by the general formula (1) are composed of two or more types of silane compounds comprising at least a tetrafunctional silane compound which corresponds to the case of n =0 in the general formula (1) and a trifunctional silane compound which corresponds to the case of n =1 in the general formula (1), and
wherein in $^{29}$Si NMR analysis, the peak intensity (A) of total tetrafunctional siloxane components in said condensation reaction product to the peak intensity (B) of components corresponding to siloxane bonding number of 4 in said condensation reaction product satisfy the following relationship:

$$\{(B)/(A)\} \geq 0.50,$$

wherein the weight average molecular weight of said condensation reaction product is 1,000 or more and 20,000 or less, and
wherein an average primary particle diameter of said silica particles is 1 nm or more and 120 nm or less.

2. The condensation reaction product solution according to claim 1, wherein said condensation component contains 50% by mass or more and 90% by mass or less in equivalent of condensate of said polysiloxane compound and 10% by mass or more and 50% by mass or less of said silica particles; and
ratio of a component derived from a tetrafunctional silane compound represented by the following general formula (2):

$$SiX^2{}_4 \quad (2)$$

{wherein $X^2$ is a halogen atom, a $C_{1-6}$ alkoxy group or acetoxy group}; in said polysiloxane compound is 5% by mole or more and 40% by mole or less.

3. The condensation reaction product solution according to claim 1 or 2, wherein ratio of a compound derived from a trifunctional silane compound represented by the following general formula (3):

$$R^2 SiX^3{}_3 \quad (3)$$

{wherein $R^2$ is a $C_{1-10}$ hydrocarbon group, $X^3$ is a halogen atom, a $C_{1-6}$ alkoxy group, or acetoxy group}; in said polysiloxane compound is 60% by mole or more and 95% by mole or less.

4. The condensation reaction product solution according to claim 1 or 2, to be used for application to fill a trench formed on a semiconductor device.

5. A method for producing the condensation reaction product solution according to claim 1 or 2, comprising:
a first step where silane compounds composed of 5% by mole or more and 40% by mole or less of tetrafunctional silane compounds represented by the following general formula (2):

$$SiX^2{}_4 \quad (2)$$

{wherein $X^2$ is a halogen atom, a $C_{1-6}$ alkoxy group, or acetoxy group}; and 60% by mole or more and 95% by mole or less of trifunctional silane compounds represented by the following general formula (3):

$$R^2 SiX^3{}_3 \quad (3)$$

{wherein $R^2$ is a $C_{1-10}$ hydrocarbon group, $X^3$ is a halogen atom, a $C_{1-6}$ alkoxy group, or acetoxy group}; are subjected to hydrolytic polycondensation in an aqueous alcohol solution under weak acidic condition of pH 5 or higher and lower than 7 to obtain polysiloxane compound;

a second step where a condensation component composed of 40% by mass or more and 99% by mass or less in equivalent of condensate of the polysiloxane compound obtained in said first step and 1% by mass or more and 60% by mass or less of silica particles are subjected to condensation reaction, in an aqueous $C_{1-4}$ alcohol solution under the condition of pH 6 to 8 at a temperature of 50° C. or higher, to obtain a reaction solution; and a third step where at least one kind of solvent having a boiling point of 100° C. or higher and 200° C. or lower selected from a group consisting of alcohol, ketone, ester, ether and hydrocarbon-based solvent is added to the reaction solution obtained in said second step, then components having a boiling point of 100° C. or lower are removed by distillation, to obtain a condensation reaction product solution.

6. A method for forming an insulating layer compri a coating step where the condensation reaction product solution according to claim 1 or 2 is coated on a substrate to obtain a coated substrate; and a curing step where said coated substrate obtained in the coating step is heated.

7. The method for forming an insulating layer according to claim 6, wherein said substrate has a trench structure.

* * * * *